United States Patent [19]

Fickler et al.

[11] 4,029,208

[45] June 14, 1977

[54] PACKAGING RECEPTACLE FOR PRINTED BOARDS

[75] Inventors: Hans Fickler, Winterthur; Walter Frankhauser, Kusnacht, both of Switzerland

[73] Assignee: Aktiengesellschaft Fur Rationelle Verpackung, Affoltern a. A., Switzerland

[22] Filed: Dec. 1, 1975

[21] Appl. No.: 636,575

[30] Foreign Application Priority Data

Dec. 6, 1974 Switzerland .................. 16218/74
Nov. 10, 1975 Switzerland .................. 14539/75

[52] U.S. Cl. .......................... 206/454; 211/41; 206/564; 206/334; 312/10

[51] Int. Cl.² ............... A47G 19/08; A45C 11/26; B65D 85/54

[58] Field of Search .................. 206/449–456, 206/334, 73; 312/10; 211/40, 41

[56] References Cited

UNITED STATES PATENTS 2,868,606  1/1959  Stierna .......................... 312/10

OTHER PUBLICATIONS

T927,008, Oct. 1974, Sherman et al., 206/454.

Primary Examiner—William Price
Assistant Examiner—Douglas B. Farrow
Attorney, Agent, or Firm—James E. Nilles

[57] ABSTRACT

A cassette type receptacle is provided with two sets of parallel internal grooves, one set extending lengthwise at one side of the receptacle and the other set of grooves extending lengthwise at the opposite side of the receptacle. Printed boards are insertable through an opening at one end of the receptacles into the spaces between the grooves so as to be closely retained against edgewise displacement but with some lateral play within the grooves. A lid for the end opening hermetically seals the interior of the receptacle.

9 Claims, 5 Drawing Figures

PACKAGING RECEPTACLE FOR PRINTED BOARDS

BACKGROUND OF THE INVENTION

Printed boards are expensive and delicate. Accordingly, they must be packaged in a particular manner for storage and shipment. Such boards are also particularly sensitive to prolonged exposure to oxygen and high humidity. They are further fragile under loads acting at right angles to their main planes. However, they are rather resistant to end loads, that is compression forces which act edgewise upon the plates and tend to upset them from their main planes.

SUMMARY OF THE INVENTION

The present invention takes care of the mentioned special conditions. It provides a packaging receptacle for at least one printed board and incorporates guide means whereby the board is closely retained against edgewise displacement and wherein the board has some lateral play at right angles to its plane.

THE DRAWINGS

Suitable embodiments of the invention are shown in the accompanying drawings, wherein.

DETAILED DESCRIPTION

Figure 1:
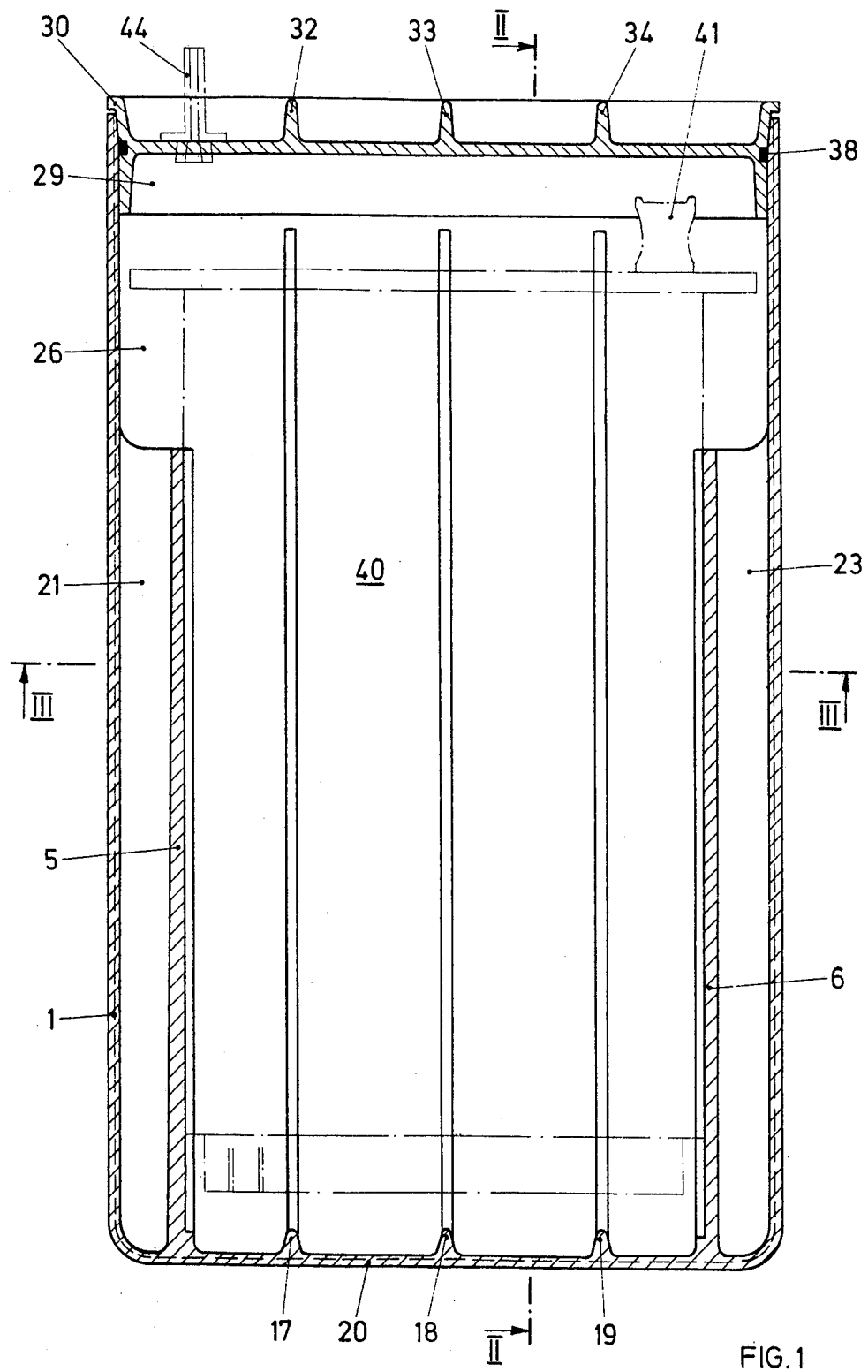
FIG. 1 is a longitudinal section along line 1—1 of FIG. 2 through a packaging receptacle for five printed boards.
Figure 2:
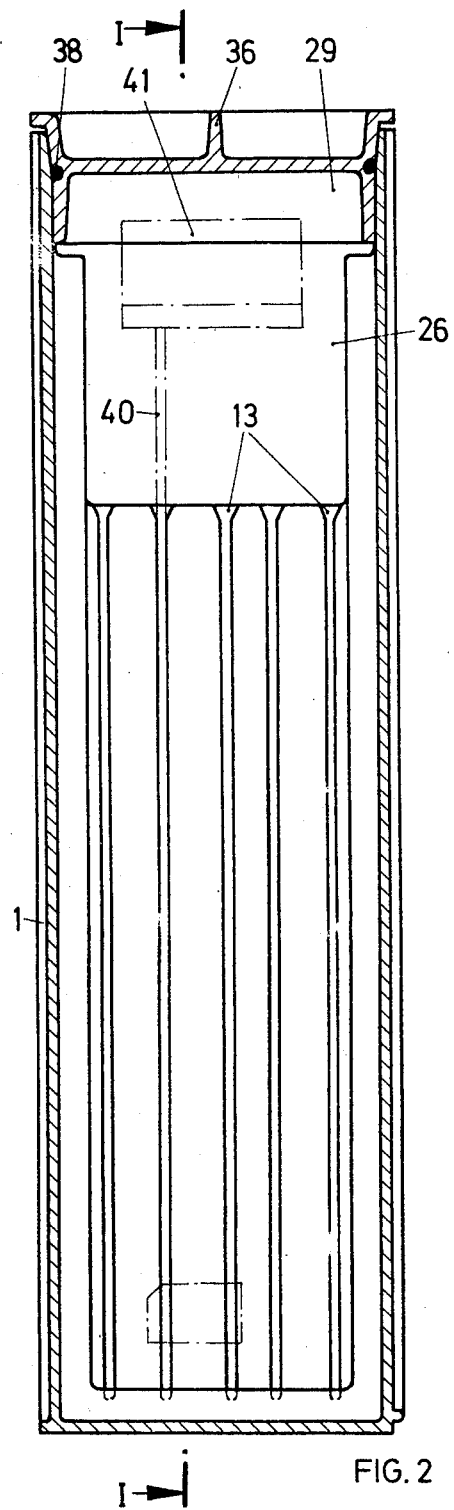
FIG. 2 is a section along line 2—2 of FIG. 1.

The receptacle according to the invention is preferably made of transparent thermoplastic material and as shown in FIGS. 1 and 2, it comprises generally a cassette-type box 1 and a cover fitted into an inwardly tapering end opening of the box.

Figure 3:
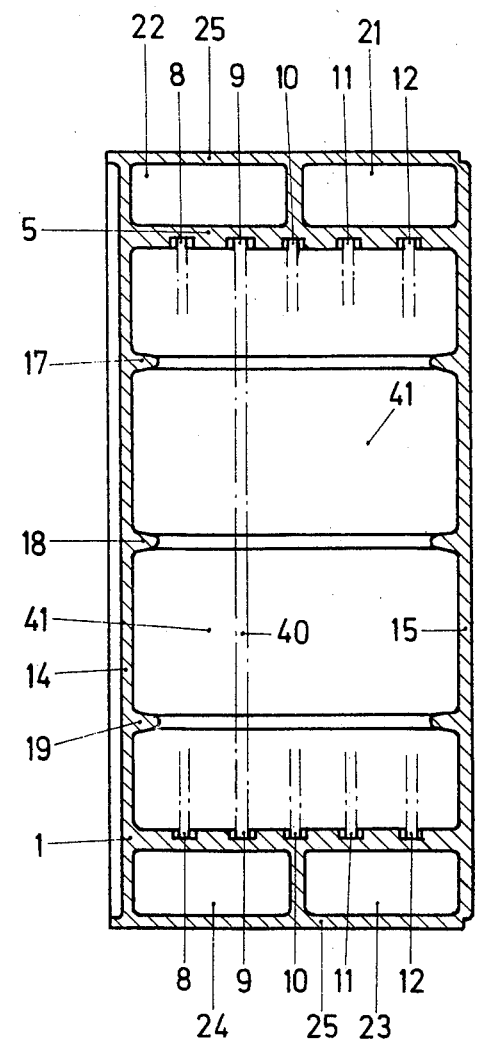
FIG. 3 is a section along line 3—3 of FIG. 1.

The interior of the box 1 is provided with two narrow walls 5 and 6 (FIG. 1) which are each formed with a set of longitudinal grooves 8, 9, 10, 11 and 12 (FIG. 3). The wide sides of the box 1 are confined by opposite parallel walls 14 and 15 (FIG. 3) which are reinforced by ribs 17, 18 and 19. A bottom wall 20 (FIG. 1) of the box 1 is likewise reinforced by extensions of the ribs 17, 18 and 19. As shown in FIG. 3, end chambers 21, 22, 23 and 24 at the opposite narrow walls of the box are confined by external walls 25. A space above the two sets of longitudinal grooves 8, 9, 10, 11 and 12, provides an upper chamber 26 (FIG. 1) which may be filled with foam type synthetic material after the printed boards have been inserted. The cover for the end opening of the box 1 is provided by a lid 29 (FIG. 1) with a rim 30. The lid 29 is reinforced by cross ribs 32, 33, 34 and a central longitudinal rib 36 (FIG. 2). A sealing ring 38 surrounds the rim 30 of the lid 29.

As shown in FIGS. 1, 2 and 3, a printing plate 40 is retained within opposite grooves 9 of the above described receptacle. The spacing between relatively opposed groove bottoms is such that the printed boards are insertable practically without edgewise play as shown in FIG. 3. Lateral play or face play of the boards within the grooves, however, is fairly large in order to prevent side pressures at right angles to the planes of the printed boards. In the lower and upper parts of the box 1 an empty space is provided to accommodate structures 41 associated with the printed boards. The necessary space to accommodate such structures which project laterally from the printed board, is provided by a suitable dimensioned width of the box 1. The lid 29 is provided with an evacuating nipple 44.

In order to facilitate the insertion of the printed boards, the longitudinal grooves 8, 9, 10, 11 and 12 are provided with flared end portions 13 (FIG. 2). The insertion of the printed boards is thereby made quite simple. Cocking of the boards is precluded because the spacings of the relatively opposed groove bottoms conform with the widths of the boards. Impacts, particularly upon the corners of the box 1, are absorbed by the respective chambers 21, 22, 23 and 24. The tapered lid 29 with its sealing ring 38 excludes fresh air from the interior of the receptacle and thereby protects the printed boards therein against outside air humidity. In order to more effectively protect the boards, particularly during shipment to tropical areas, the interior of the receptacle may be evacuated by means of an evacuating nipple 44 and the evacuated receptacle may be refilled with an inert gas such as nitrogen at atmospheric pressure or a slight over pressure. Thereafter, the evacuating nipple which for instance may consist of soft synthetic material may be welded shut. In this manner, a prolonged storage time for the boards may be afforded and spoilage of the plates by humidity or oxygen as well as spoilage of the associated connections and conduits will be prevented. The disclosed receptacle is also immunized against impacts so that the printed boards will be well protected against mechanical damage.

The subdividing partitioning walls may be made suitably long and numerous in order to adapt the receptacle to differently dimensioned printing plates by suitably shortening and/or breaking out chambers forming wall portions of the box 1.

Figure 4:
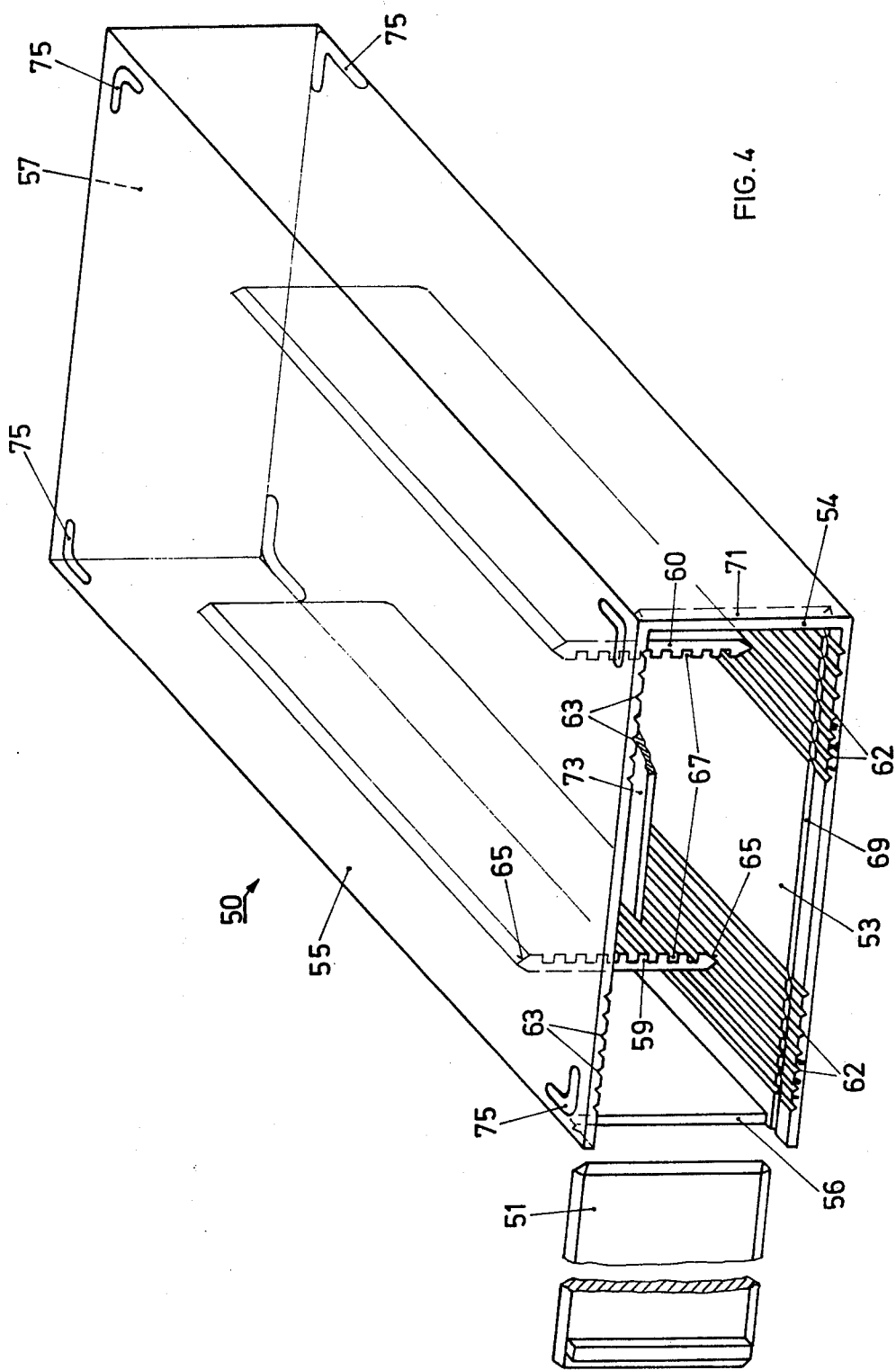
FIG. 4 is a perspective view of a modification of the embodying of the invention shown in FIGS. 1—3.

FIG. 4 shows a perspective view of a modified packaging receptacle for a number of printed boards. Here, a box 50 is provided with a sliding lid 51. The box 50 comprises four side walls 53, 54, 55, 56 and a bottom wall 57 opposite to the lid 51. Within the interior of the box 50, two partitioning walls 59 and 60 are arranged in transversely adjustable relation to each other and guided for lengthwise movement into and out of the box, the partitioning walls 59 and 60 being adapted to support the printed boards. The relatively opposed wide walls 53 and 55 are provided with longitudinal grooves 62 and 63 which are arranged in two groups and which extend over the full length of the walls 53 and 55, the grooves being of approximately triangular cross section.

The partitioning walls 59 and 60 are retained in the longitudinal grooves 62 and 63 and are provided with triangularly shaped guide surfaces 65 matching the grooves 62 and 63. One face of each of the partitioning walls 59 and 60 is provided with longitudinal grooves 67 of square or rectangular cross section into which the printed boards may be inserted.

At the lid end of the box 50 the two walls 53 and 55 are provided with cross grooves 69 which preferably are also of triangular cross section and serve to guide the lid 51 at its correspondingly shaped edges. Recessed into the wall 54 is a sealing groove 71 of triangular cross section into which the leading end of the lid 51 enters upon closing of the lid, the leading end of the lid being of triangular cross section matching the triangular cross section of the groove 71. FIG. 4 shows part of an inserted printed board 73.

For purposes of identification, as shown in FIG. 4, the longitudinal grooves 62 are marked with numerals, for instance at the end faces of the wide walls 53 and 55 in order to simplify and insure proper insertion of the partitioning walls 59 and 60. These identification indicia are applied to all four groups of longitudinal grooves 62, 63 so that the partitioning walls 59 and 60 may readily be inserted at the proper distance from each other into the selected longitudinal grooves. This adjustability of the partitioning walls 59 and 60 incidentally provides for convenient adaptation of the receptacle to printed boards of different widths and thus affords a universal packaging container for printed boards and the like. In other respects, the FIG. 4 embodiment of the invention affords the various advantages which have been pointed out with reference to the embodiment shown in FIGS. 1 to 3. The wide side walls 53 and 55 are additionally provided with bosses 75 which permit stacking of the receptacles on top of each other as well as 90° turned side by side stacking.

Figure 5:
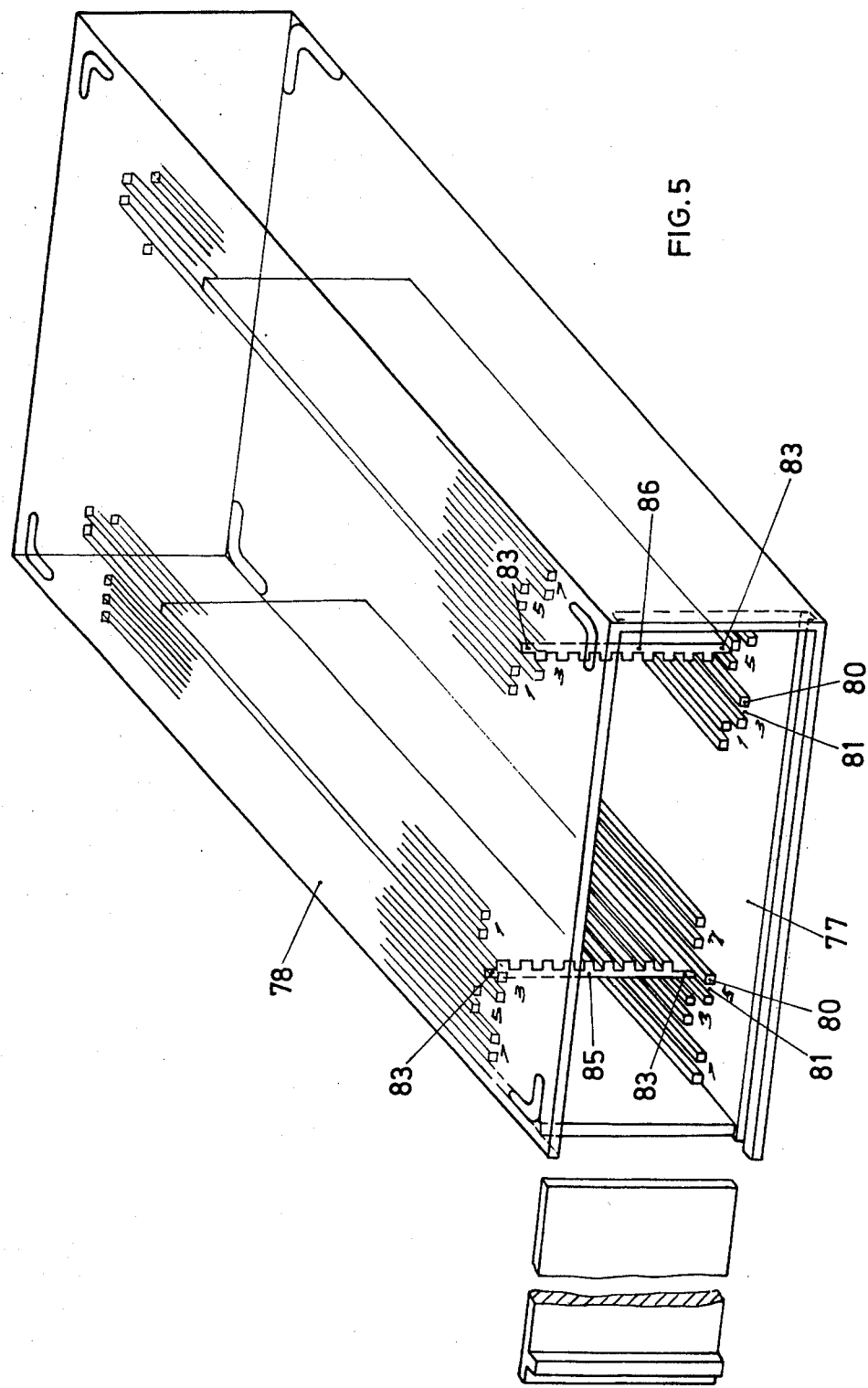
FIG. 5 is a perspective view of the preferred embodiment of the invention.

FIG. 5 which shows the preferred form of the packaging receptacle embodying the invention is basically constructed like the receptacle shown in FIG. 4. The only, but nevertheless significant differences between the FIG. 4 and FIG. 5 embodiments are as follows:

The two wide walls 53 and 55 of FIG. 4 are designated in FIG. 5 by the numerals 77 and 78. Instead of being provided with recessed grooves 62 and 63, as in FIG. 4, the wide walls 77 and 78 of FIG. 5 are provided with slim rods 80 of approximately square cross section, the spacings between these rods providing longitudinal grooves 81. The guide edges 83 of the partitioning walls 85 and 86 are shaped to match the grooves 81.

The length of the rods 80 is shorter than the length of the FIG. 5 receptacle and these rods are grouped in pairs of different length. The various pairs of rods are all provided with identifying indicia or numerals in order to facilitate the proper insertion of the partitioning walls 85 and 86.

We claim:

1. A packaging receptacle for printed boards comprising: internal guide means for supporting at least one printed planar board and for restraining said board against displacement in the plane of the board and for affording lateral slideable play of said printed board perpendicular to the plane defined by the printed board, said internal guide means comprising a pair of spaced apart, generally parallel walls, a first groove in one of said walls for receiving a first edge of the board and a second groove in the other of said walls, opposite said first groove and for receiving a second edge of said board opposite said first edge, said grooves each having a bottom receiving said board thereagainst, the bottoms of said first and second grooves being spaced apart by a dimension substantially equal to the width of said board.

2. A receptacle according to claim 1 further including a pair of spaced apart side walls, said side walls having opposed surfaces, said surfaces each including longitudinal grooves for slideably supporting said pair of spaced apart, generally parallel walls.

3. A receptacle according to claim 1 wherein said grooves are marked with identifying indicia.

4. A receptacle according to claim 1 and further comprising means for selectively positioning said wall elements at different transverse spacings from each other.

5. A receptacle as set forth by claim 1 and further comprising a pair of spaced apart side walls between said generally parallel walls, said side walls each having an outer surface, and means for permitting stacking of a plurality of receptacles including stacking bosses on said outer surface of each of said side walls.

6. A receptacle according to claim 2 wherein said parallel walls are shorter than said side walls of the receptacle.

7. A receptacle according to claim 1 wherein said receptacle defines a box having an inwardly tapering end opening and a lid element sealing fitted into said end opening.

8. A receptacle according to claim 7 wherein said lid element is provided with an evacuating nipple.

9. A container according to claim 7 wherein said box portion is provided with chamber forming wall elements opposite to said end opening.

* * * * *